(12) United States Patent
Boulard et al.

(10) Patent No.: US 10,128,386 B2
(45) Date of Patent: Nov. 13, 2018

(54) SEMICONDUCTOR STRUCTURE COMPRISING AN ABSORBING AREA PLACED IN A FOCUSING CAVITY

(71) Applicant: COMMISSARIAT A L'ENERGIE ATOMIQUE ET AUX ENE ALT, Paris (FR)

(72) Inventors: Francois Boulard, Grenoble (FR); Roch Espiau De Lamaestre, Grenoble (FR); David Fowler, Saint Martin le Vinoux (FR); Olivier Gravrand, Fontanil Cornillon (FR); Johan Rothman, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/402,020

(22) PCT Filed: Jun. 19, 2013

(86) PCT No.: PCT/EP2013/062771
§ 371 (c)(1),
(2) Date: Nov. 18, 2014

(87) PCT Pub. No.: WO2013/189997
PCT Pub. Date: Dec. 27, 2013

(65) Prior Publication Data
US 2015/0303320 A1 Oct. 22, 2015

(30) Foreign Application Priority Data

Jun. 20, 2012 (FR) .................................... 12 55786

(51) Int. Cl.
*H01L 31/0232* (2014.01)
*H01L 31/103* (2006.01)
(Continued)

(52) U.S. Cl.
CPC ........ *H01L 31/02327* (2013.01); *H01L 31/10* (2013.01); *H01L 31/109* (2013.01);
(Continued)

(58) Field of Classification Search
CPC ........... H01L 27/1464; H01L 31/02327; H01L 31/10; H01L 31/109; H01L 31/0232; H01L 27/14649; H01L 27/14652
See application file for complete search history.

(56) References Cited

U.S. PATENT DOCUMENTS 5,952,703 A    9/1999  Murakami et al.
6,034,407 A *  3/2000  Tennant ............ H01L 27/14652
                                                    257/440
(Continued)

FOREIGN PATENT DOCUMENTS

EP    2276072 A1    1/2011
GB    2206447 A  *  1/1989  ......... H01L 31/0232

OTHER PUBLICATIONS

Stanaszek et al. "Mid and long IR detection modules for picosecond range measurements" in Proceedings of SPIE vol. 7482. Published by SPIE in 2009.*
(Continued)

*Primary Examiner* — Jesse Y Miyoshi
*Assistant Examiner* — Tuan A Hoang
(74) *Attorney, Agent, or Firm* — Oblon, McClelland, Maier & Neustadt, L.L.P.

(57) ABSTRACT

A semiconducting structure configured to receive electromagnetic radiation, a method for manufacturing such a structure, and a semiconductor component, the semiconductor structure including: a first semiconducting area of a first type of conductivity, a second semiconducting area of a second type of conductivity opposite to the first type of conductivity, the second area being in contact with the first
(Continued)

Figure 1:
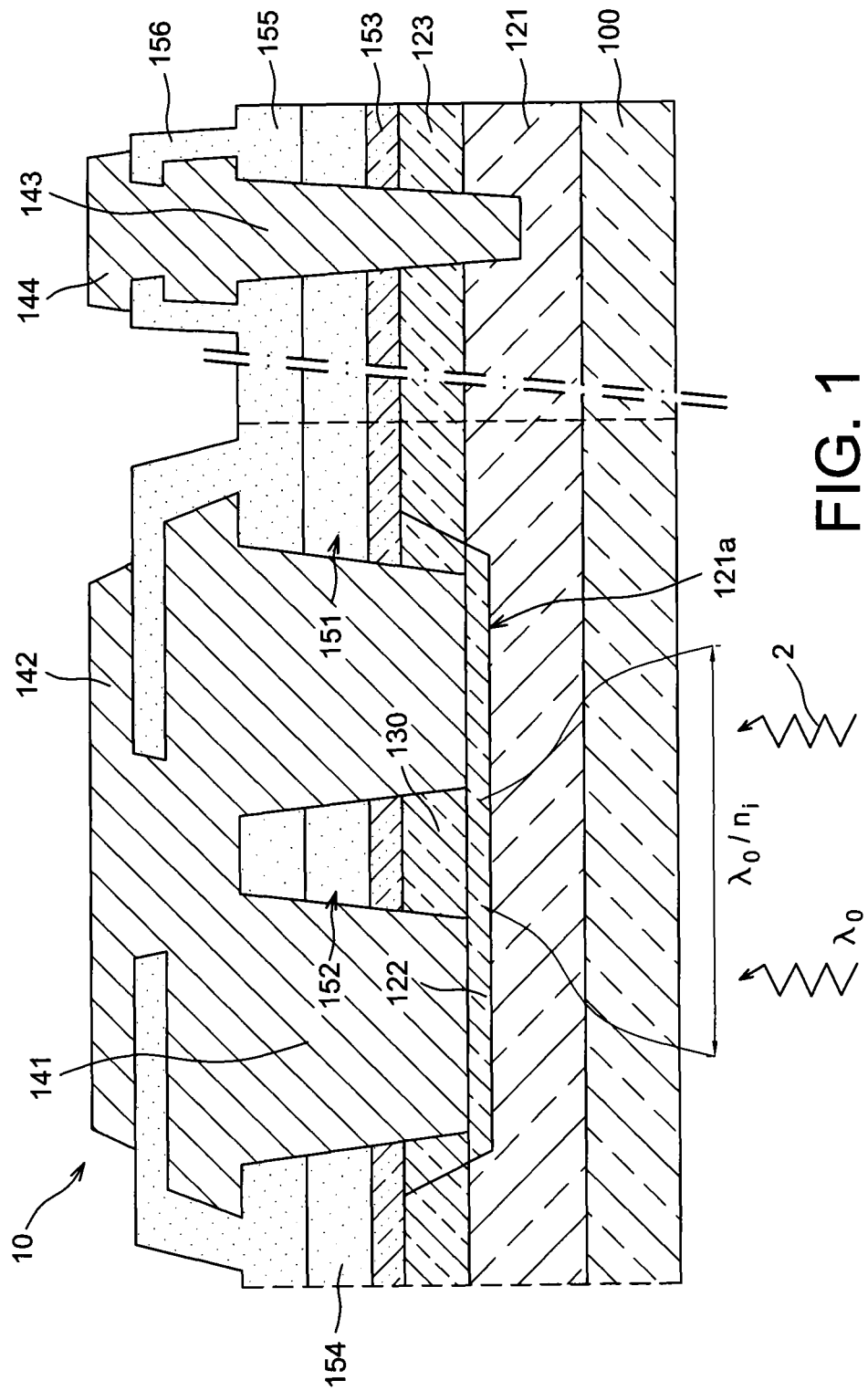

area to form a semiconducting junction. The second area includes a portion for which a concentration of majority carriers is at least ten times less than a concentration of majority carriers of the first area. The second area and its portion are essentially made in a first cavity configured to focus in the first cavity at least one portion of the electromagnetic radiation.

3 Claims, 12 Drawing Sheets

(51) Int. Cl.
*H01L 31/109* (2006.01)
*H01L 31/10* (2006.01)
*H01L 31/18* (2006.01)

(52) U.S. Cl.
CPC ...... *H01L 31/1032* (2013.01); *H01L 31/1035* (2013.01); *H01L 31/18* (2013.01)

(56) References Cited

U.S. PATENT DOCUMENTS

| | | |
|---|---|---|
| 6,803,557 B1 | 10/2004 | Taylor et al. |
| 7,459,730 B1 | 12/2008 | Kinch |
| 7,504,672 B1 | 3/2009 | Kinch |
| 7,608,830 B1 | 10/2009 | Kinch |
| 2005/0045910 A1 | 3/2005 | Taylor et al. |
| 2011/0018087 A1* | 1/2011 | Boutami ............... H01L 31/101 257/442 |
| 2012/0012816 A1* | 1/2012 | Choi ..................... B82Y 20/00 257/14 |
| 2014/0312446 A1 | 10/2014 | Gravrand et al. |

OTHER PUBLICATIONS

Stanaszek et al. "Mid and long IR detection modules for picosecond range measurements" in Proceeding of SPIE vol. 7482. Published by SPIE in 2009.*
Jaksic et al. "Disperson of Refractive index in degenerate Mercury Cadmium Telluride" in Proceedings of 21st International Conference on Microelectronics, 14-17. Published by IEEE in 1997.*
Dickman, "Experiment 03: Fabry-Perot Resonator" in Fachbereich Physikal. Technik. Published by MEOS GmbH in 2003.*
U.S. Appl. No. 14/370,581, filed Jul. 3, 2014, Gravrand et al.
International Search Report dated Aug. 5, 2013 in PCT/EP2013/062771 filed Jun. 19, 2013.
French Preliminary Search Report dated Apr. 11, 2013 in French Patent Application No. 1255786 filed Jun. 20, 2012.
D. Stanaszek, et al., "Mid and long infrared detection modules for picosecond range measurements," SPIE, Conference Proceedings, Electro-optical remote Sensing, Photonic Technologies and Applications III, vol. 7482, XP040502300, Sep. 1, 2009, pp. 74820M-1-7482M-11.
J. Piotrowski, et al., "Uncooled long wavelength infrared photo detectors", Infrared Physics and Technology, vol. 46, No. 1-2, XP025960146, Dec. 1, 2004, pp. 115-131.
U.S. Appl. No. 14/420,814, filed Feb. 10, 2015, Boulard, et al.
U.S. Appl. No. 14/758,707, filed Jun. 30, 2015, Rothman.
U.S. Appl. No. 14/795,129, filed Jul. 9, 2015, Mollard, et al.

* cited by examiner

SEMICONDUCTOR STRUCTURE COMPRISING AN ABSORBING AREA PLACED IN A FOCUSING CAVITY

TECHNICAL FIELD

The invention relates to the field of detection and/or measurement of electromagnetic radiations and to the devices allowing such detection and/or measurement.

With the rapid development of optoelectronics, related to the adaptation of technologies of micro-electronics to a semiconductor with a direct gap, it has been possible to improve detection and/or measurement performances of devices allowing detection and/or measurement of electromagnetic radiations regardless of their range of wavelengths.

These devices generally apply semiconducting structures able to receive electromagnetic radiation and to transform it into an electric signal.

The invention more particularly relates to a semiconducting structure, to a semiconductor component and to a method for manufacturing such a semiconductor structure.

STATE OF THE PRIOR ART

Semiconducting structures adapted for receiving electromagnetic radiation generally comprise a first and second semiconducting area in contact with each other and respectively exhibiting a first and a second type of conductivity opposite to each other. In this way the first and the second area form together, at their contact, a semiconducting junction.

Thus, for a support for which the semiconductor material is a direct gap semiconductor material and for a reverse bias of the junction, when a photon, having a greater energy than that of the band gap of the semiconductor material, penetrates the semiconducting junction, the latter will generate an electron-hole pair which, because of the electric field prevailing in the structure, diffuses into the structure so as to form a photogenerated current. This current, being directly proportional to the electromagnetic radiation, provides a measurement of the same electromagnetic radiation.

By direct gap semiconductor material is meant a semiconducting material for which the energy maximum of the valence band and the energy minimum of the conduction band are located at a value of the wave vector k substantially equal in the energy dispersion diagram of said semiconducting material.

If such a technology is well adapted for detecting and measuring electromagnetic radiations, it nevertheless has the drawback of having a non-zero darkness current, which contributes to degrading the signal-to-noise ratio. The darkness current originates from the generation of a non-photogenerated electron-hole pairs in the structure. Now this generation mainly occurs in the active area of the structure in which the photons are absorbed in order to generate the signal. This area, in order to maximize the signal, should occupy a large portion of the volume of the structure, the latter generally extending over the quasi-totality of the surface of the structure, and is therefore at the origin of significant noise.

This is all the more true for structures adapted for operating in infrared wavelengths, the latter being subject to significant noise because of the narrow band gap width of the material in which they are formed. Indeed, a narrow band gap width promotes the formation of a tunnel darkness current in the active area.

In order to find a remedy to this drawback, it is known how to concentrate the electromagnetic radiation in a reduced area of the structure in which the junction and therefore the active area are made. Thus, a structure may receive the electromagnetic radiation on a significant surface area without however requiring an active area occupying a significant volume.

Such a concentration of an electromagnetic radiation may notably be obtained, as this is described in document EP 2276072, by means of a concentrator of the Fabry-Pérot type which allows concentration of the electromagnetic radiation in a reduced area of the structure in which the junction may be made.

If document EP 2276072 does not specify any structural configuration, it is nevertheless necessary, for such a structure to be functional, that the junction be made in the semiconducting layer at which the concentrator of the Fabry-Pérot type concentrates the electromagnetic radiation. The result of this is that, for a structure adapted for receiving electromagnetic radiation for which the wavelength is $\lambda_0$, the thickness of the structure on which is captured the electromagnetic radiation is limited by the semiconducting layer in which the junction is made. This layer should have a thickness comprised between $\lambda_0/4n_e$ and $\lambda_0/10n_e$, the thickness of the active area of the junction on which the electromagnetic radiation is absorbed is therefore reduced and a part of the electromagnetic radiation may, due to this small thickness, cross the structure without being absorbed.

The result of this is that, if such a structure has, relatively to a simple reverse-biased diode, a reduction of the darkness current, this reduction is also accompanied by a reduction in the absorption level of the electromagnetic radiation. The gain in the signal-to-noise ratio provided by this solution, relatively to a simple reverse-biased diode, is therefore reduced due to the small thickness of the active area on which the electromagnetic radiation is absorbed.

DISCUSSION OF THE INVENTION

The present invention aims at founding a remedy to this drawback.

An object of the invention is to provide a semiconducting structure which has an optimized signal-to-noise ratio as compared with the structures of the prior art.

For this purpose, the invention relates to a semiconducting structure intended to receive electromagnetic radiation in a first range of wavelengths, said to be operating range, which is centered around a wavelength $\lambda_0$, including:
  a first semiconducting area of a first type of conductivity,
  a second semiconducting area of a second type of conductivity opposed to the first type of conductivity, the second semiconducting area being in contact with the first semiconducting area so as to form a semiconducting junction,
  the second semiconducting area having a portion for which the concentration of majority carriers is at least ten times less than the concentration of majority carriers of the first semiconducting area, said portion being in contact with the first semiconducting area,
  said portion of the second semiconducting area being essentially made in a first cavity adapted for focusing in the first cavity a portion of the received electromagnetic field.

The arrangement of the second semiconducting area in a first cavity adapted for concentrating the electromagnetic field and the fact that the portion of the second semiconducting area has a reduced concentration of majority carriers as compared with the first semiconducting area, allow the structure to have its active area, formed by the space charge area of the junction, mainly comprised in the cavity. Indeed, the second semiconducting area having a portion with reduced concentration of majority carriers, the space charge area, corresponding to the active area, mainly extends in this portion.

Further, the relatively low concentration of majority carriers of the second semiconducting area portion induces depletion of the majority carriers in the same portion of the second semiconducting area, thus limiting the risks of recombinations of electron-hole pairs which is the source of the darkness current. Finally, it may be noted that such a configuration of the structure, by the band curvature induced along the portion of the second semiconducting area allows collection of the photogenerated minority carriers by the flow of the latter along the portion and not by diffusion. The collection time is there by reduced, as compared with a structure collecting the photogenerated current by the diffusion of carriers. The response of the structure is therefore made reliable as compared with the structures of the prior art which have a greater probability of recombination of the photogenerated electron-hole pairs before their collection. The result of this is that a structure according to the invention allows reproducible calibration with increased sensitivity as compared with a structure according to the prior art.

A cavity comprised in an optoelectronic component may be a resonant or optical cavity, such as a cavity of the Fabry-Pérot type. Thus, such as a cavity is therefore not necessarily empty since it may contain, for example, an active medium as this is the case for a component of the semiconductor laser type.

By focusing in the field of optics and of optoelectronics, is meant the fact of having light converge so as to be concentrated in a small volume.

Moreover, it is possible, for an equivalent signal-to-noise ratio level, to increase the operating temperature of the device.

By portion essentially arranged in the cavity, is meant that the portion is at least partly positioned in the cavity, the portion of the second semiconducting area having more than half of its volume arranged in the first cavity.

The portion of the second semiconducting area represents the major portion of the second semiconducting area which is arranged in the first cavity.

The first cavity may be a cavity of the Fabry-Pérot type particularly adapted for allowing concentration of an electromagnetic field.

If the first cavity is a cavity of the Fabry-Pérot, the first cavity may have along at least one confinement direction, an average size substantially equal to $\lambda_0/2n_{eff}$ with $n_{eff}$ being the average effective index in the second semiconducting area.

A Fabry-Pérot cavity for which the average size is substantially equal to $\lambda_0/2n_{eff}$ is particularly adapted for concentrating an electromagnetic radiation for which the wavelength is comprised in the operating range.

As the structure is intended to receive the electromagnetic radiation along an average receiving direction, the confinement direction may be substantially perpendicular to the average receiving direction.

Such an orientation of the confinement dimension gives the possibility of obtaining confinement of the structure along a direction perpendicular to the junction allowing dimensioning, if need be, of the thickness along which the portion extends, thereby limiting the portion of the electromagnetic radiation which would not be absorbed during its passing into the structure.

It may also be noted that in the configuration in which the junction substantially extends in the plane of the surface of the structure, such a direction of the dimension of the cavity allows focusing of the transverse electric (TE) component of the electromagnetic field.

The dimension of the first cavity along the confinement direction is a variable dimension, said dimension preferentially decreasing from the first semiconducting area to the second semiconducting area.

Such a variable dimension gives the possibility of widening the range of wavelengths of the electromagnetic radiation which is focused in the first cavity.

The dimension of the first cavity along the confinement direction substantially varies monotonously along the direction from the first semiconducting area to the second semiconducting area.

The dimension of the first cavity along the confinement direction varies according to an angle comprised between 0 and 40° relatively to the direction from the first semiconducting area to the second semiconducting area.

The junction may be a heterojunction.

Such a type of junction gives the possibility of adapting the band gap width of each semiconducting area and may allow optimization of the part of the electromagnetic radiation absorbed by a functional semiconducting area of the junction.

The first and the second semiconducting area may have band gap widths of different energies, the second semiconducting area may have a greater average band gap width energy than that of a radiation for which the wavelength is comprised in the operating range.

By energy corresponding to the band gap width is meant above and in the remainder of this document, the energy difference between the energy minimum of the conduction band and the energy maximum of the valence band, this at the temperature at which the semiconducting structure is intended to operate.

Thus, the electromagnetic radiation, in a configuration in which the electromagnetic radiation crosses the first semiconducting area before arriving in the second semiconducting area, exhibits reduced attenuation during its passage through the first semiconducting area.

The first and the second semiconducting areas may have band gap widths of different energies, the first semiconducting area having an average band gap width energy less than that of a radiation for which the wavelength is comprised in the operating range.

Thus, the second semiconducting area is particularly adapted for absorbing the electromagnetic radiation.

The second semiconducting area includes, in addition to said portion, a part not arranged in the cavity and having a greater average band gap width energy than that of electromagnetic radiation for which the wavelength is comprised in the operating range, and said portion having an average band gap energy width less than that of electromagnetic radiation for which the wavelength is comprised in the first operating range.

With such a configuration of the second semiconducting area, absorption of radiation only occurs in the cavity.

The first semiconducting area may have a band gap width which decreases toward the second semiconducting area.

The electromagnetic radiation may be received in a medium with an optical index $n_i$ a so-called incident index, the ratio between the effective index and the incident index $n_{eff}/n_i$ being greater than 1, preferentially substantially greater than 1.5, and even more preferentially greater than 2.

With receiving radiation in a medium of an optical index $n_i$, such a ratio between the effective index $n_{eff}$ and the incident index $n_i$ gives the possibility of providing good focusing of the electromagnetic radiation in the cavity.

By optical index of a medium is meant above and in the remainder of the document, the refractive index of the medium for the first range of wavelengths.

The medium of incident index $n_i$ may be a support of a structure.

The medium of incident index $n_i$ may be an air area through which the radiation is received by the structure.

The first and the second semiconducting areas may be made in semiconducting materials essentially consisting of at least three same elements for which the concentration of at least of one of these elements gives the possibility of varying the band gap width, said element being preferentially cadmium (Cd), mercury (Hg) and tellurium (Te).

Such elements allow, by varying the concentration of at least one of these elements, modification of the band gap width along the structure giving access as well as the possibility of optimizing of this band gap width according to the semiconducting areas of the structure and their function.

Indeed, mercury-cadmium tellurides inter alia have the advantages of having a band gap width which varies with the concentration of cadmium without this affecting their direct gap semiconductor property. Thus, it is possible, by varying the proportions of the elements which are tellurium (Te), cadmium (Cd) and mercury (Hg), to form a heterojunction with a band gap width of each of the semiconducting areas of the junctions which is adapted according to the needs.

The operating range may be comprised in the range of infrared wavelengths.

Provision may be made for:
a transparent support in the operating range, the substrate including a first and a second face,
a first semiconducting layer of the first type of conductivity extending along the first face in contact with this same first face, a portion of said first semiconducting layer forming the first semiconducting area,
a semiconducting mesa in direct contact, or via a second semiconducting layer of the second type of conductivity, with the face of the first semiconducting layer which is opposite to the first face, said mesa having the second type of conductivity and on a portion of the mesa a concentration of majority carriers which is at least ten times less than that of the first semiconducting layer, said mesa at least partly forming the second semiconducting area, the mesa having at least one direction, the confinement direction, along which the mesa has an average size of $\lambda_0/2n_{eff}$, the part of the mesa at least partly forming the portion of the second semiconducting area,
an area, a so-called a reflective area, made in a material at least partly reflective in the operating range, the reflecting area covering at least a part of the mesa so as to form the first cavity of the Fabry-Pérot type which has an average size substantially equal to $\lambda_0/2n_{eff}$ along the confinement direction.

Such a structure is particularly adapted to optoelectronic manufacturing constraints.

A second semiconducting layer in contact with the surface of the first face which is opposite to the first face, may be provided, the mesa being in direct contact with the second semiconducting layer and in contact with the first semiconducting layer through the second semiconducting layer, the second layer having at least a part for which the concentration of majority carriers is ten times less than that of the first semiconducting layer, the second semiconducting layer and the mesa forming the second semiconducting layer and the respective part of the mesa and of the second semiconducting layer forming the portion of the second semiconducting area.

The mesa may be in direct contact with the first semiconducting layer.

Further, at least a third of a fourth semiconducting area may further be provided, respectively having the first and the second type of conductivity, the third and fourth semiconducting area being in contact with each other so as to form a semiconducting junction, the fourth semiconducting area having a second portion for which the concentration of majority carriers is at least ten times less than the concentration of the majority carriers of the third semiconducting area, said second portion being a portion of the fourth semiconducting area which is in contact with the third semiconducting area, the fourth semiconducting area is essentially made in a second cavity, said second cavity being adapted for concentrating in the second cavity, a part of the electromagnetic radiation which is received by the structure and for which the wavelength is comprised in a range of wavelengths, a so-called second operating range.

Such third and fourth semiconducting areas and the second cavity which is associated with them, allow an increase in the surface area of the structure on which the electromagnetic radiation is collected and therefore in the signal provided by the structure when the latter receives electromagnetic radiation.

They also give the possibility, for a second operating range different from the first operating range, of providing an adapted structure for receiving electromagnetic radiation both in the first operating range and in the second operating range.

The second operating range is substantially identical with the first operating range.

Thus, the structure has, for electromagnetic radiations for which the wavelength is comprised in the first operating range, a surface for receiving these electromagnetic radiations which is increased as compared with a structure not including a second cavity adapted for focusing in the second cavity a portion of the electromagnetic radiations which is received by the structure and for which the wavelength is comprised in the first operating range.

The second operating range may be different from the first operating range, the first and the second operating range being preferentially selected so as to cover a continuous range of wavelengths.

Thus, the structure is adapted for receiving electromagnetic radiations over a range of wavelengths of greater width than a structure not including any second cavity.

The invention also relates to a semiconducting component including a plurality of semiconducting structures intended to receive electromagnetic radiation, at least one of the structures being a structure according to the invention.

Such a component has, for the structure(s) according to the invention, an optimized signal-to-noise ratio as compared with a component only including structures according to the prior art.

The invention also relates to a method for manufacturing a structure intended to receive electromagnetic radiation in a first range of wavelengths, a so-called operating range, which is centered around a wavelength $\lambda_0$, the method including the steps:
providing a support having a first and a second face, forming a first semiconducting layer of a first type of conductivity, at least one portion of said semiconducting layer forming a first semiconducting area, forming a semiconducting mesa in contact with the semiconducting layer, said mesa being of a second type of conductivity opposed to the first type of conductivity and including at least one portion, in contact with the first semiconducting layer, for which the concentration of majority carriers is at least ten times less than the concentration of majority carriers of the first semiconducting layer, the mesa having at least one direction, a so-called confinement direction, along which the mesa has an average dimension of $\lambda_0/2n_{\mathit{eff}}$, the mesa at least partly forming with a second semiconducting area, depositing a layer of a material at least partly reflective in the operating range so as to form a so-called reflective area, the reflective area covering at least a part of the mesa so as to form a first cavity of Fabry-Pérot type which has an average dimension substantially equal to $\lambda_0/2n_{\mathit{eff}}$ along to the confinement direction.

Such a method allows formation of a structure having in the operating range an improved signal-noise ratio as compared with a structure of the prior art.

The manufacturing method may include between the step for forming the first semiconducting layer and the step for forming the mesa, a step for forming a second semiconducting layer of the second type of conductivity in contact with the first semiconducting layer on the face of the first semiconducting layer which is opposite to the support, the mesa being formed in contact with the second semiconducting layer.

Alternatively, the method for manufacturing a structure intended to receive electromagnetic radiation in a first range of wavelengths, a so-called operating range, which is centered around a wavelength $\lambda_0$, may include the steps:

providing a support having a first and a second face, forming a first semiconducting layer of a first type of conductivity, at least one portion of said first semiconducting layer forming a first semiconducting area, forming a second semiconducting layer in contact with the first semiconducting layer, said second semiconducting layer being of a second type of conductivity which is opposed to the first type of conductivity, at least a part of the second semiconducting layer which is in contact with the first semiconducting layer having a concentration of majority carriers which is at least ten times less than the concentration of majority carriers of the first semiconducting layer, forming a semiconducting mesa in contact with the part of the second semiconducting layer, said mesa being of the second type of conductivity and at least comprising a part, in contact with the portion of the second semiconducting layer, for which the concentration of majority carriers is at least ten times less than the concentration of majority carriers of the first semiconducting layer, the mesa having at least one direction, a so-called confinement direction, along which the mesa has an average dimension of $\lambda_0/2n_{\mathit{eff}}$, the mesa at least partly forming with the second semiconducting layer a second semiconducting area and the part of the mesa forming with the part of the second semiconducting layer a portion of the second area, depositing a layer of a material at least partly reflective in the operating range, said layer covering at least a part of the mesa so as to form a first cavity of the Fabry-Pérot type so which has an average dimension substantially equal to $\lambda_0/2n_{\mathit{eff}}$ along the confinement direction.

Before the step for forming the second semiconducting layer, a step for forming a third semiconducting layer of the first type of the conductivity in contact with the first semiconducting layer may be provided, the first layer and the third semiconducting layer including a concentration of impurities of the majority carrier donor type of the second type of the conductivity which at least ten times less than the concentration of majority carriers of said first and third semiconducting layers, the steps for forming the mesa and the second semiconducting layer being obtained by etching the third conductive layer and a portion of the first semiconductive layer, this etching step being adapted for inhibiting the majority carriers of the first type of conductivity.

SHORT DESCRIPTION OF THE DRAWINGS

Figure 2:
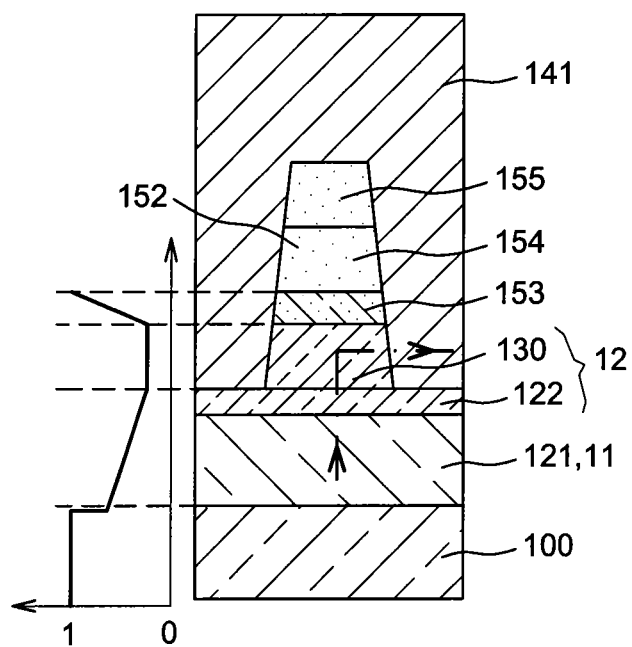
Figure 3:
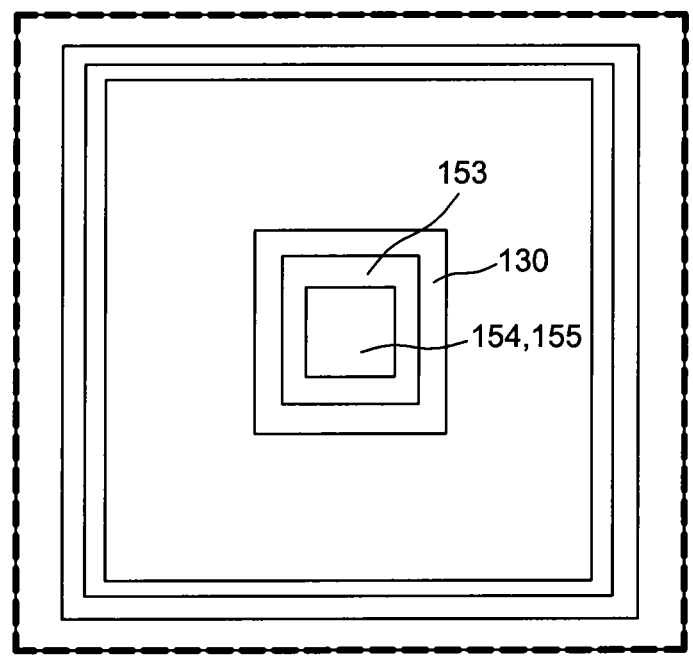
Figure 4A:
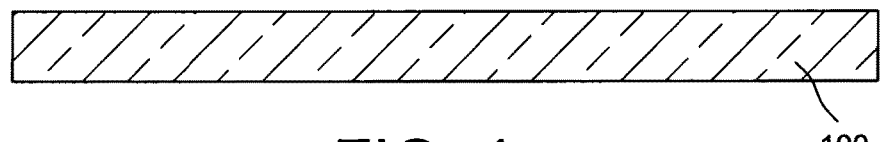
Figure 4B:
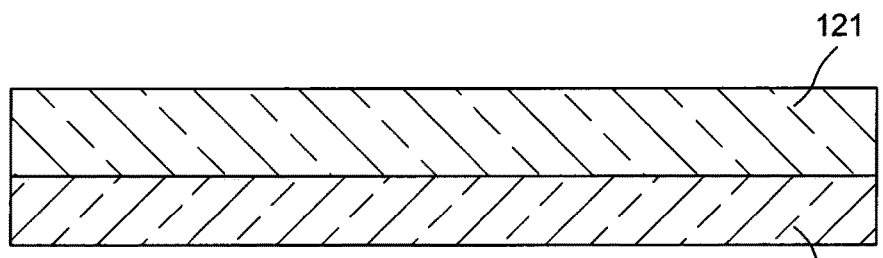
Figure 4C:
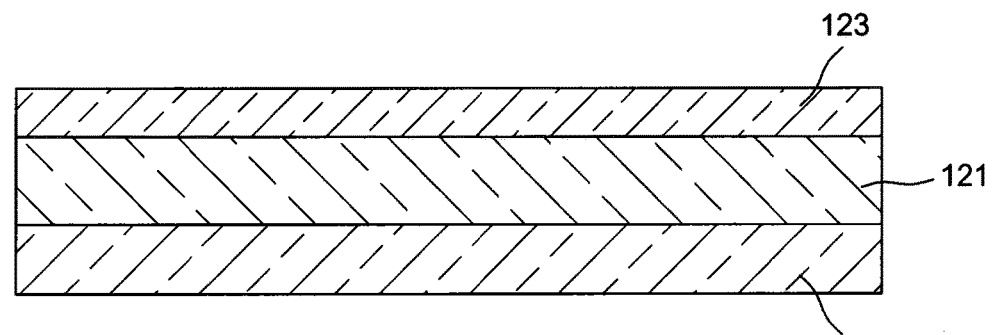
Figure 4D:
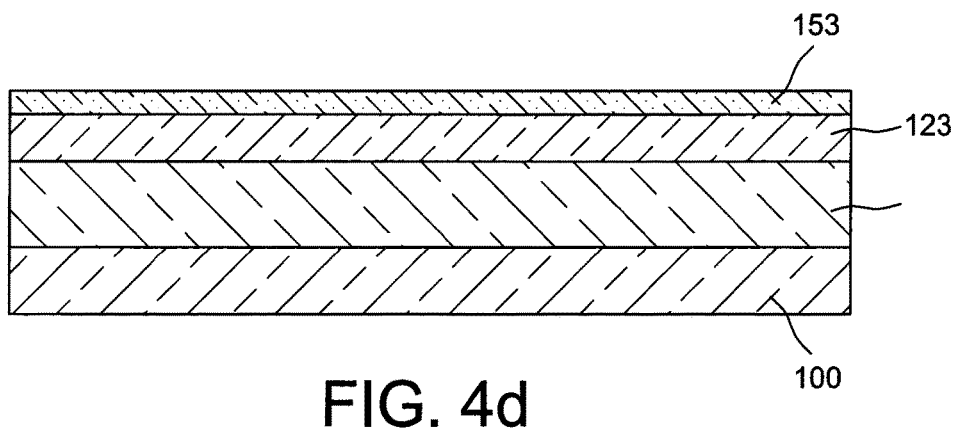
Figure 4E:
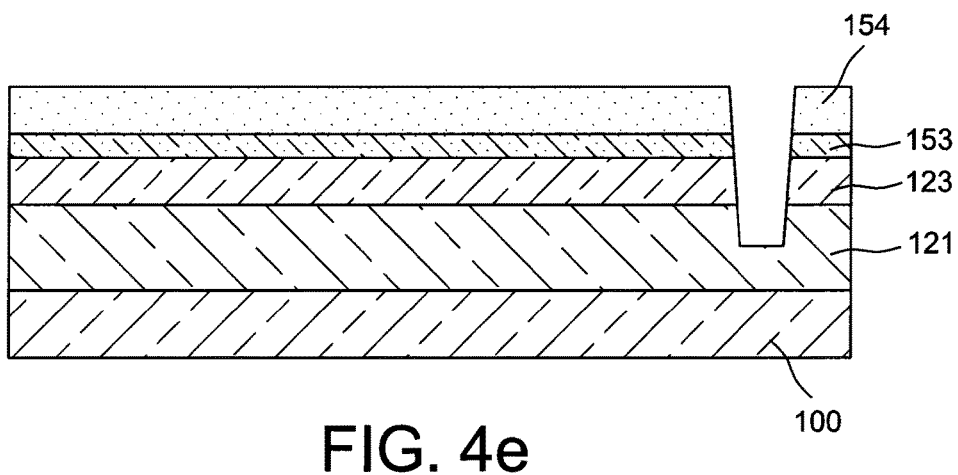
Figure 4F:
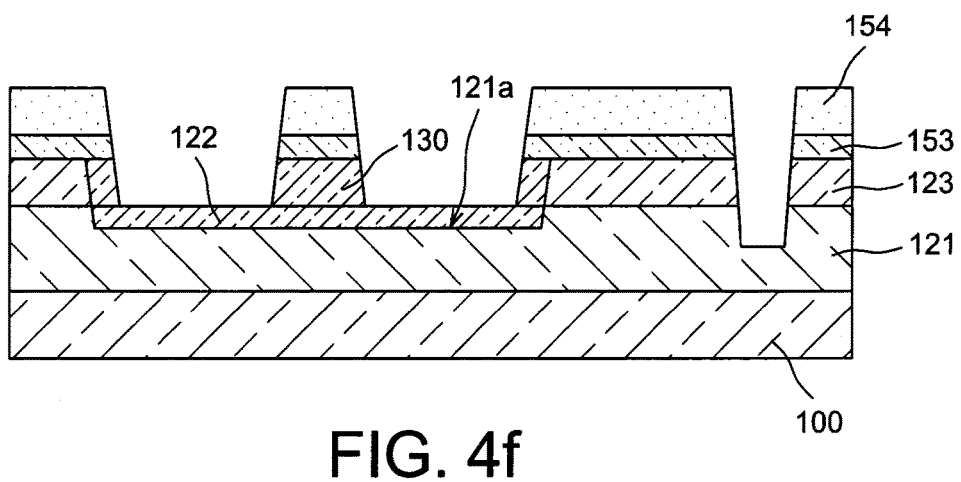
Figure 4G:
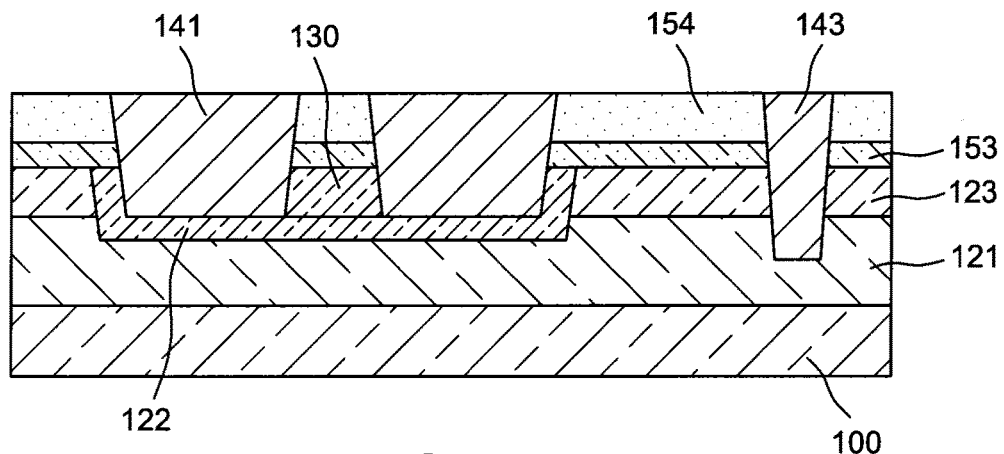
Figure 4H:
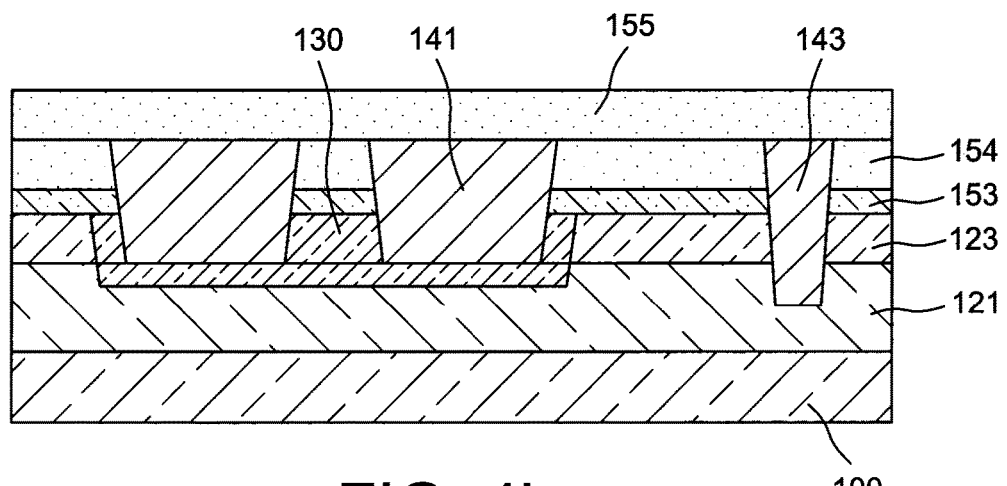
Figure 4I:
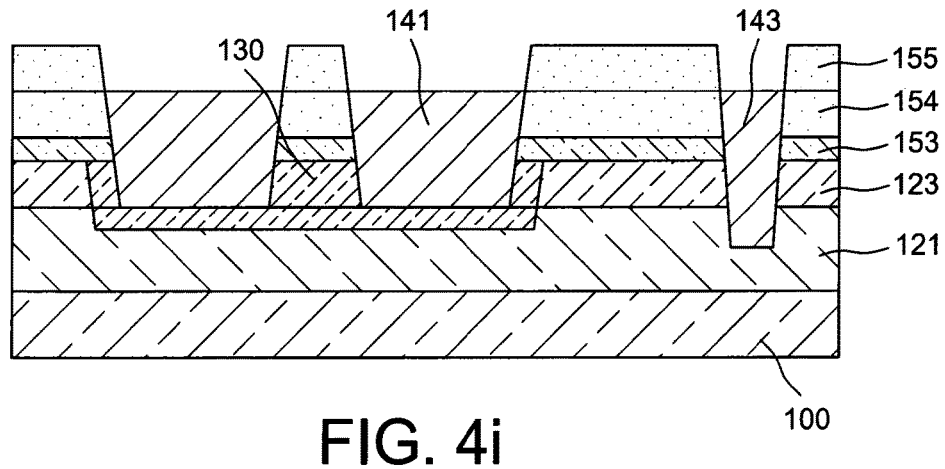
Figure 4J:
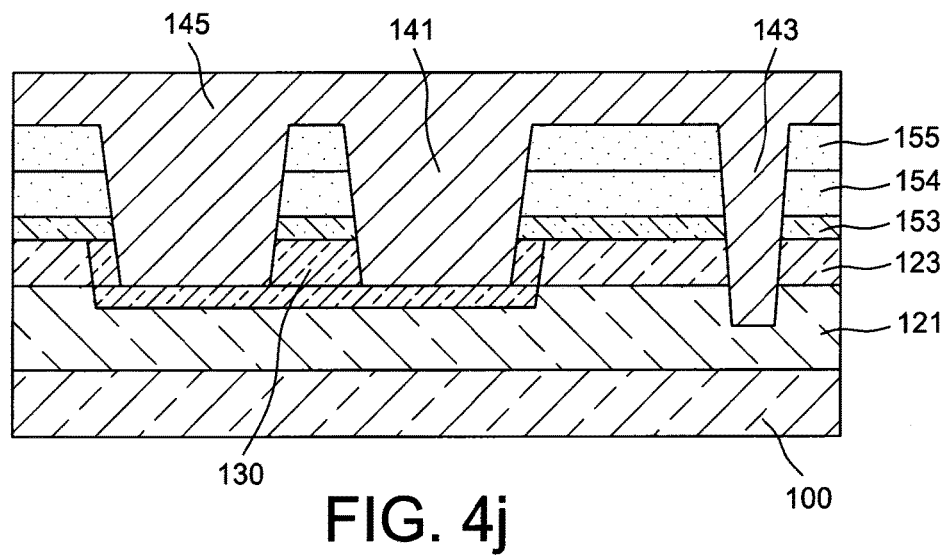
Figure 4K:
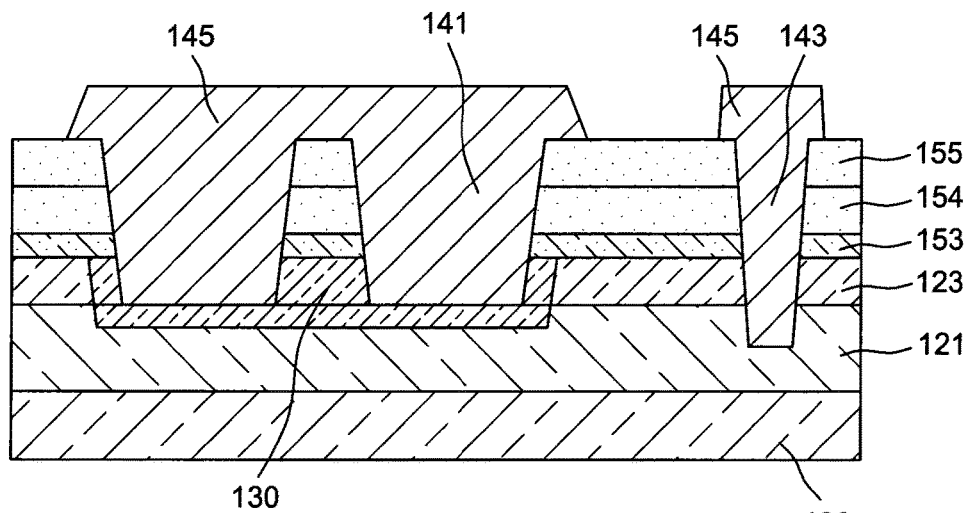
Figure 4L:
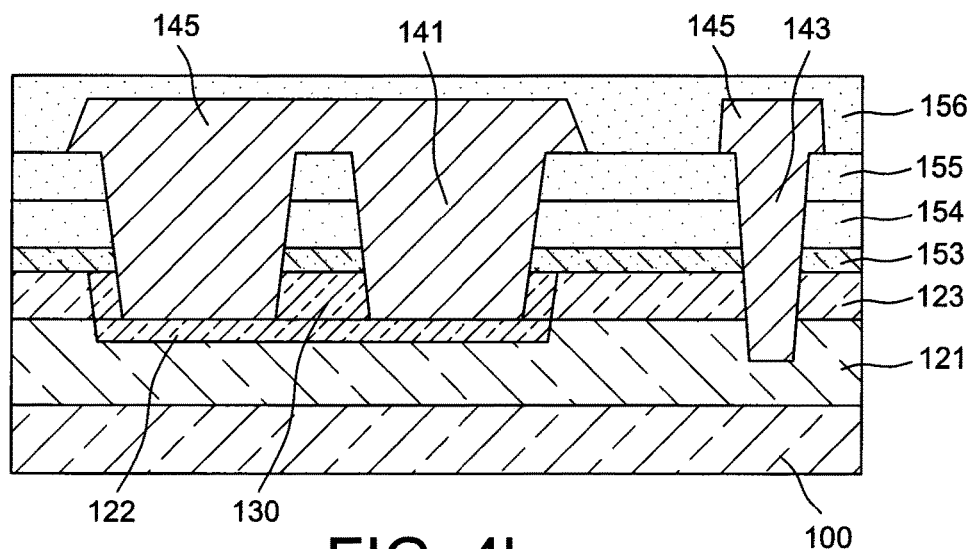
Figure 4M:
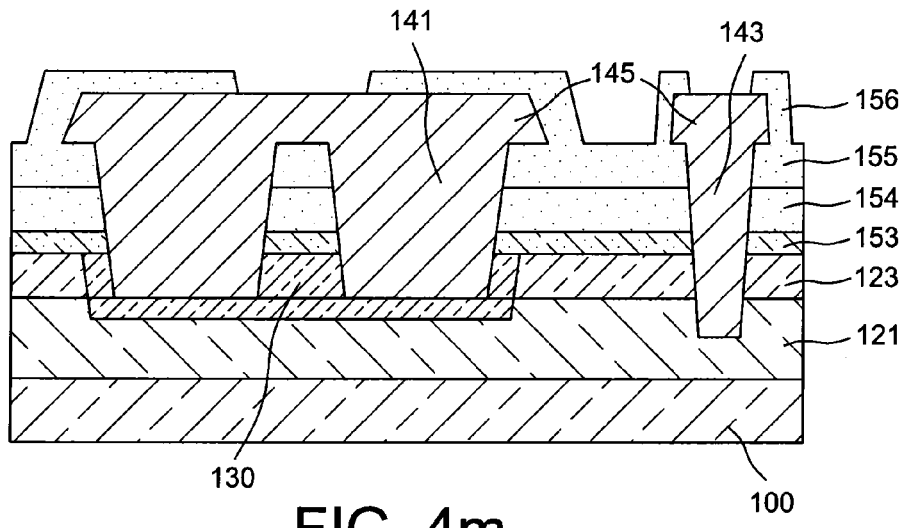
Figure 4N:
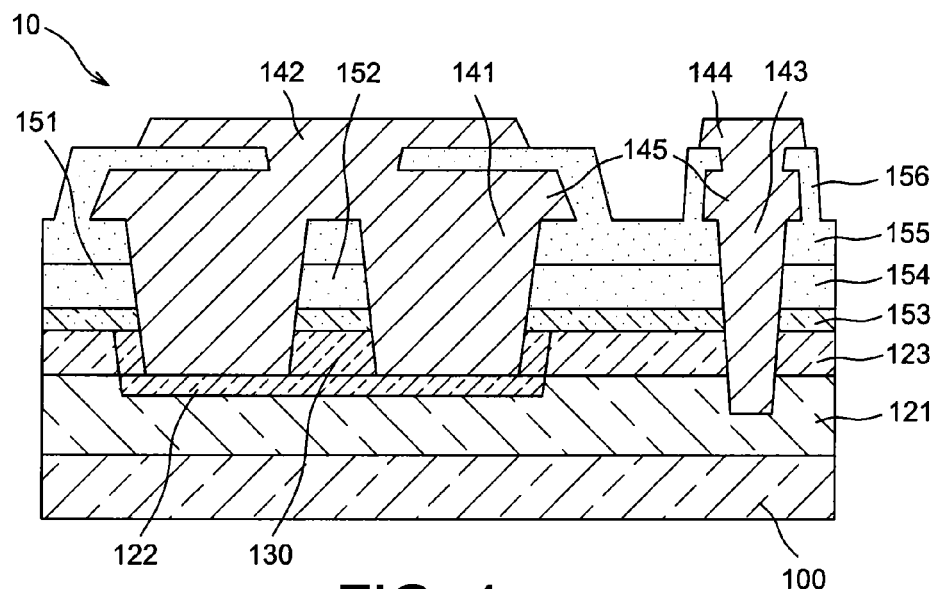
Figure 5:
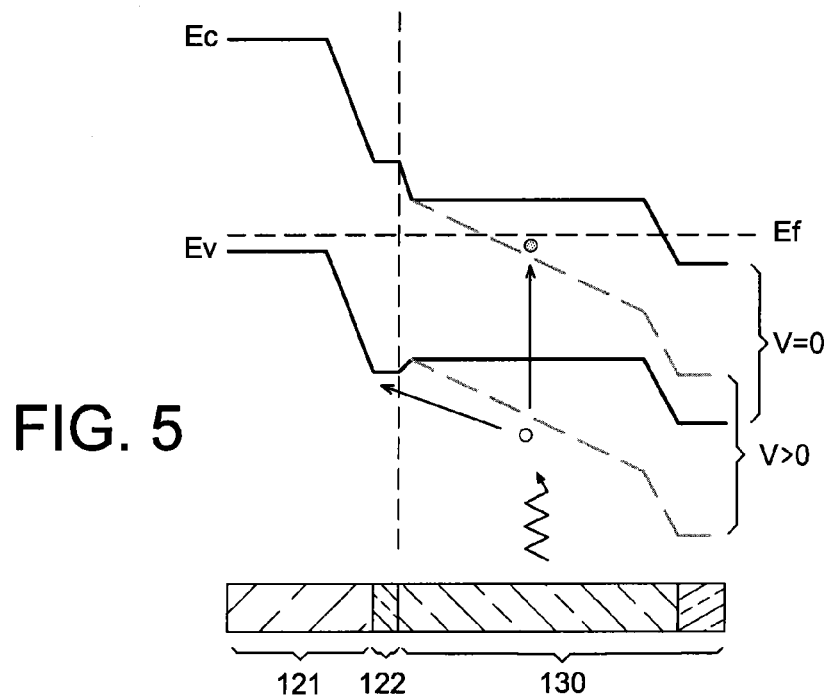
Figure 6:
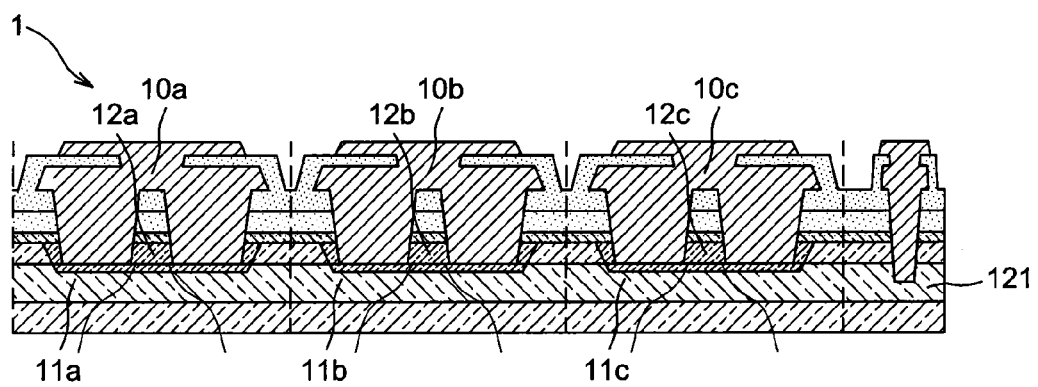
Figure 7:
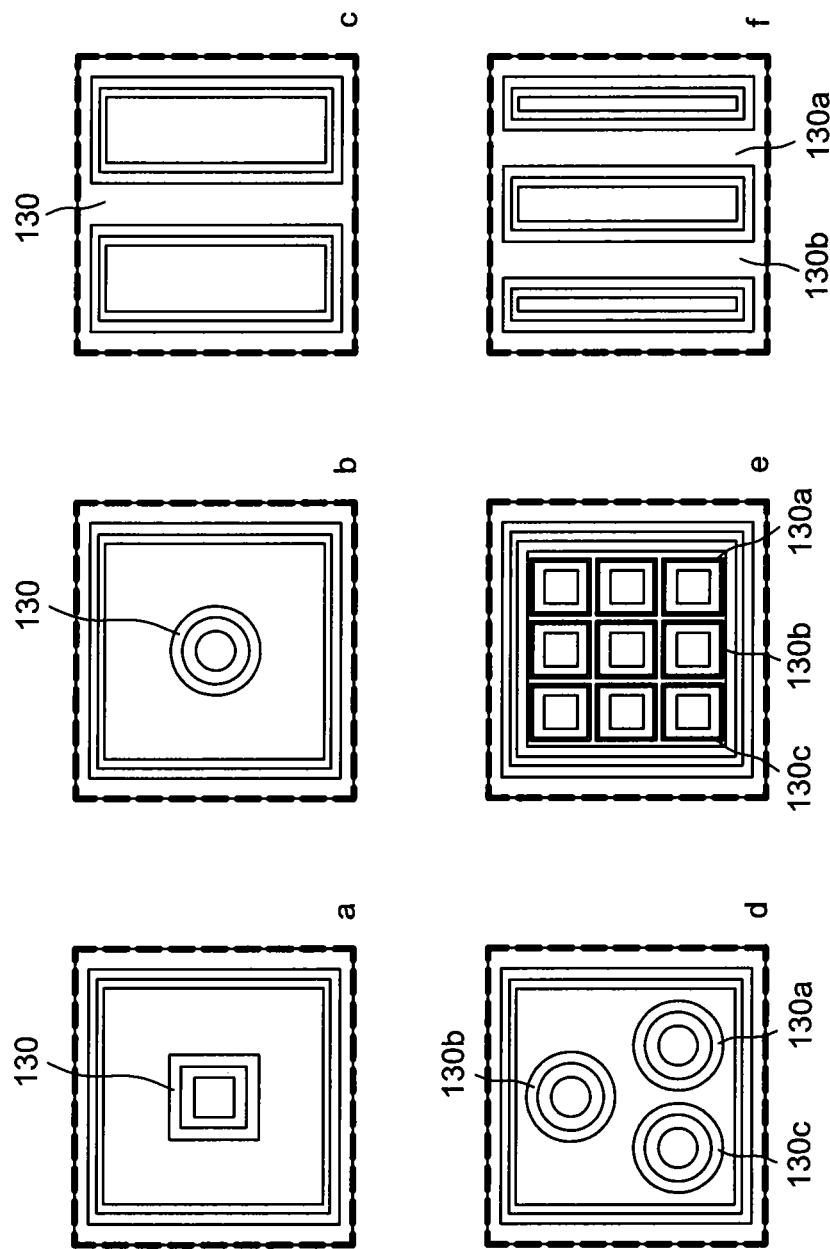
Figure 8:
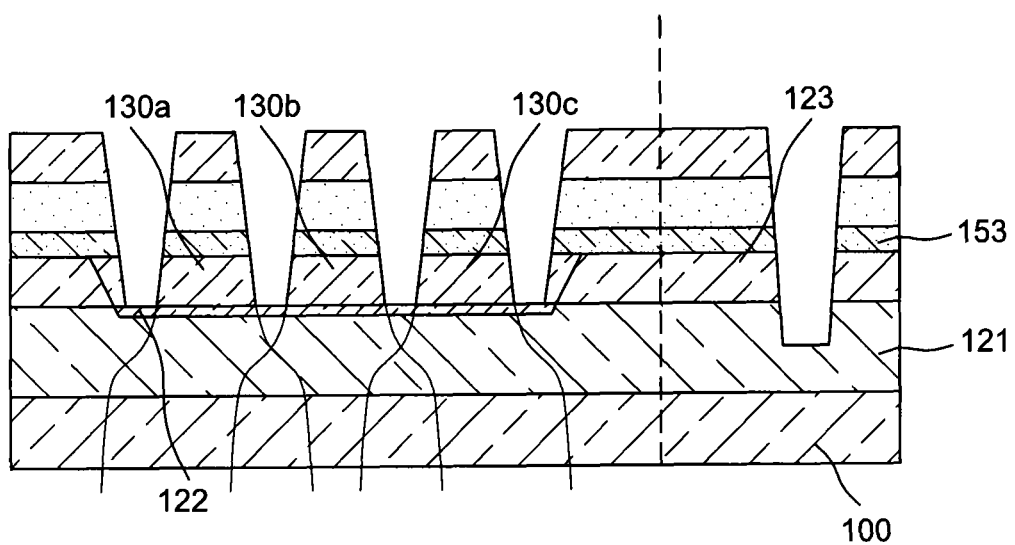

The present invention will be better understood upon reading the description of exemplary embodiments, given purely as an indication and by no means as a limitation, with reference to the appended drawings wherein:

FIG. 1 illustrates a sectional view of an exemplary structure according to the first embodiment of the invention, FIG. 2 Illustrates the cadmium distribution along a structure illustrated in FIG. 1, FIG. 3 Illustrates an example of a configuration of a structure according to the first embodiment of the invention, FIGS. 4a to 4n illustrate the steps of a method for manufacturing a structure as illustrated in FIG. 1, FIG. 5 illustrates an example of a band structure along a structure according to the first embodiment of the invention, FIG. 6 illustrates a component including several structures according to the invention, FIGS. 7a to 7f illustrate examples of configuration of structures according to different possibilities of the invention, FIG. 8 illustrates a sectional view of a structure according to a possibility of the invention in which the structure includes several cavities, FIGS. 9a to 9d illustrate different steps for manufacturing a structure according to a second embodiment of the invention.

Identical, similar or equivalent portions of the different figures show the same numerical references so as to facilitate passing from one figure to the other.

The different portions illustrated in the figures are not necessarily illustrated according to a uniform scale, in order to make the figures more legible.

The different possibilities (alternatives and embodiments) should be understood as not being exclusive of each other and may be combined together.

DETAILED DISCUSSION OF PARTICULAR EMBODIMENTS

FIG. 1 illustrates a semiconducting structure 10, intended to receive electromagnetic radiation 2 in a first range of wavelengths, according to a first embodiment of the invention. The first range of wavelengths, which is a so-called operating range, is centered around a wavelength $\lambda_0$.

The first operating range is a range of wavelengths which may be comprised as well as in the range of a visible wavelengths, ultraviolet wavelengths, or further infrared wavelengths. In the particular application illustrated in FIG. 1, the range of wavelengths is comprised in the infrared and may, depending on the needs, be a range of near infrared wavelengths, medium infrared wavelengths or far infrared wavelengths.

The features and values which are mentioned in the remainder of this document, when they are indicated as relating to the particular application, only apply to this particular application, and therefore by no means limit the scope of the invention.

A structure 10 according to the first embodiment includes:
- a support 100, optionally, a semiconducting support, transparent in the operating range, the support including a first and a second face,
- a first semiconducting layer 121 of the first type of conductivity extending along a first face of the support in contact with this same first face,
- a second semiconducting layer 122 of the second type of conductivity extending along a region of a first layer in contact, in said region, with the face of the first layer which is opposite to the first face of the support,
- a third semiconducting layer 123 in contact with the first layer on the first layer face opposite to the support, the third semiconducting layer being in contact on the surface of said face which is not covered by the second semiconducting layer,
- a semiconducting mesa 130 in contact with the second semiconducting layer 122 on the surface of the second semiconducting layer 122 which is also opposite to the first semiconducting layer 121, said mesa 130 having the second type of conductivity,
- a so-called reflective area 141 made in a conductive material which is at least partly reflective in the operating range, said reflective area 141 in contact with the mesa 130 on the sides of the mesa 130 and with the second semiconducting layer 122 on its face which is opposite to the first semiconducting layer 121 in the part of said face which is not in contact with the mesa 130, said material being an electrically conductive material, the reflective area 141 forming a first electric contact,
- a first and a second insulating area 151, 152 in a insulating material, the first insulating area 151 being in contact with the third semiconducting layer 123 and the second insulating area 152 with the mesa 130,
- a second electric contact 143 in contact with the first semiconducting layer 121 through the first insulating area 151 and the third semiconducting layer 123.

The semiconducting support 100 is a support conventionally used for optoelectronic applications. The support is preferentially a transparent substrate in the first operating range. The support 100 is made in a semiconducting material conventionally used for optoelectronic applications, such as for example silicon, silicon carbide, sapphire. The support has an optical index or a refractive index $n_i$.

In the particular application of the invention, the support 100 is a zinc-cadmium telluride (CdZnTe) substrate, which is transparent in the infrared wavelength range. Thus, the actual electromagnetic radiation for which the wavelength is comprised in the operating range is transmitted through the support 100 without being absorbed. The support is preferentially at least partly insulating. In the same particular application, the optical index $n_i$ of the support is 2.7.

The support 100 is a substantially planar support, a first face of which is in contact with the first semiconducting layer 121. The second face of the support 100 is the face of the structure which, as this is illustrated in FIG. 1, receives the electromagnetic radiation.

The first semiconducting layer 121 is a semiconducting layer adapted for optoelectronic applications. The first semiconducting layer 121 is made in a direct gap semiconducting material such as gallium arsenide (GaAs), and indium phosphide (InP). The first semiconducting layer 121 has the first type of conductivity. The first type of conductivity is a conductivity type selected from the group including the type of conductivity for which the majority carriers are electrons and the type of conductivity for which the majority carriers are holes.

The concentration of majority carriers of the first semiconducting layer 121 is significantly substantial. It thus has good conductivity. The first semiconducting layer 121 may for example have a concentration of majority carriers greater than $10^{17}$ cm$^{-3}$. The band gap width of the first semiconducting layer 121 is preferentially of greater energy than that of electromagnetic radiation for which the wavelength is comprised in the operating range. The band gap width of the first semiconducting layer 121 may either be variable or constant along its thickness. In the case when the band gap width of the first semiconducting layer 121 is variable along its thickness, the first semiconducting layer 121 has a band gap width which decreases towards the second semiconducting layer 122. The reduction in the band gap width along the thickness of the first semiconducting layer 121 may be continuous or stepwise.

In the particular application, the first semiconducting layer 121 is a mercury-cadmium telluride layer of the $Cd_xHg_{1-x}Te$ type with X being the cadmium proportion which is comprised between 0.2 and 1. The minimum value of the cadmium proportion X is selected according to the operating range so that the first semiconducting layer 121 has a band gap width, for which the energy is greater than that of electromagnetic radiation for which the wavelength is comprised in the operating range.

Thus, for structures 10 adapted for receiving electromagnetic radiation in the field of medium infrared wavelengths of less than 3 µm, the minimum cadmium proportion X may be greater than 0.5 and for the range of medium infrared wavelengths of less than 5 µm, the cadmium proportion X may be greater than 0.4. For structures 10 adapted for receiving electromagnetic radiation in the range of far infrared wavelengths of less than 10 µm, the minimum cadmium proportion X may be greater than 0.3.

In the particular application, the band gap width has a continuous variation along the thickness of the first semiconducting layer 121. Such a variation is obtained, as illustrated in FIG. 2, by varying the cadmium concentration along the thickness of the first semiconducting layer 121 from a value of 0.5 at the support to a value, at the second semiconducting layer 122, greater than that of the mesa 130, for example 0.32.

In the particular application, the type of conductivity of the first semiconducting layer 121 is a type of conductivity for which the majority carriers are holes. Also the concentration of majority carriers of the first semiconducting layer 121 is comprised, in the particular application between $10^{16}$ and $10^{18}$ cm$^{-3}$, preferentially greater than $10^{17}$ cm$^{-3}$.

The thickness of the first semiconducting layer 121 is comprised between 50 nm and 50 µm and is adapted depending on the application of the structure 10.

Thus, in the particular application, the first semiconducting layer 121 is adapted for filtering the electromagnetic radiation for which the wavelength is comprised in the near infrared. Such an adaptation is obtained by providing a first semiconducting layer 121 with a suitable band gap width and for which the thickness is equal to several times the wavelength of the radiation to be filtered. For this purpose, the first semiconducting layer 121 has a thickness comprised between 5 and 50 µm.

The first semiconducting layer 121 has a region 121a in which the face, which is opposite to the first face of the support is set back relatively to the surface plane formed by the remainder of the face of the first semiconducting layer 121. The region 121a of the first layer may, as illustrated in FIG. 3, be with a square shape. The region 121a of the first layer is in contact with the second semiconducting layer 122. The second semiconducting layer 122 mainly extends along the region 121a of the face of the first semiconducting layer 121.

Alternatively, the first semiconducting layer 121 may not have a set-back region. The second semiconducting layer 122 is then formed in the third semiconducting layer 123 and will be flush with the first semiconducting layer 121.

The portion of the first semiconducting layer 121 which is in contact with the second semiconducting layer 122 forms a first semiconducting area 11 of the structure 10.

The second semiconducting layer 122 is a semiconducting layer adapted for optoelectronic applications. The second semiconducting layer 122 is preferentially made in a direct gap semiconducting material such as gallium arsenide (GaAs) and indium phosphide (InP). The second semiconducting layer has a second type of conductivity which is opposed to the first type of conductivity.

The second semiconducting layer 122 has on the major portion of its thickness a band gap width for which the energy is greater than that of electromagnetic radiation for which the wavelength is comprised in the first operating range. In order to allow a transition between first semiconducting layer 121 and the mesa 130, the band gap width of the second semiconducting layer 122 may vary from the semiconducting layer 121 to the mesa 130 from the minimum band gap width on first semiconducting layer 121 to the band gap width of the mesa 130 at its base.

The concentration of majority carriers of the second semiconducting layer 122 is at least ten times less than the concentration of majority carriers of the first semiconducting layer 121. The concentration of majority carriers of the second semiconducting layer 122 is comprised between $10^{14}$ and $10^{18}$ cm$^{-3}$.

In the particular application, the second semiconducting layer 122 is a mercury-cadmium telluride layer of $Cd_xHg_{1-x}Te$ type with X being the cadmium proportion comprised between 0.2 and 1. The minimum value of the cadmium proportion X is selected depending on the operating range so that the second semiconducting layer 122 has a band gap width, for which the energy is greater than that of electromagnetic radiation for which the wavelength is comprised in the operating range, this according to the same principle as for the first semiconducting layer 121.

In the particular application, the second semiconducting layer has a band gap width which continuously varies along the thickness of the second semiconducting layer 122. Such a variation is obtained, as illustrated in FIG. 2, by varying the cadmium concentration along the thickness of the second semiconducting layer 122.

The second semiconducting layer 122 forms with the first semiconducting layer 121 a semiconducting junction.

The mesa 130 is in contact with the second semiconducting layer 122 on the face of the second semiconducting layer 122 which is opposite to the first semiconducting layer 121.

The mesa 130, as illustrated in FIG. 3, has a general shape of a pyramid frustum with a square base. The mesa 130 may also have, according to alternatives of the invention, a general frusto-conical or prism frustum shape. The mesa 130 is in contact with the second semiconducting layer 122 through its base. The angle of each of faces of the mesa 130 relatively to the base is comprised between 60° and 90°. Each side of the mesa 130 has an average width substantially equal to $\lambda_0/2n_{eff}$ with $n_{eff}$ being the average effective index of the mesa 130 in the operating range.

The ratio of the average effective index $n_{eff}$ over the optical index of the support $n_i$ is preferentially greater than 1, still preferentially greater than 1.5, and more advantageously greater than 2.

The height of the mesa 130 is both adapted to the operating range and to the problem of reducing the darkness current. Thus, the mesa 130 has sufficient height for absorbing electromagnetic radiation 2 for which the wavelength is comprised in the operating range and sufficiently small so that the mesa 130 does not have a too large volume at the origin of the darkness current.

Thus, in the particular application, for an operating range for which the wavelength $\lambda_0$ is equal to 4 µm, the width and the height of the mesa may be selected as being equal to 750 nm and 250 nm, respectively.

The mesa 130 is made in a direct gap semiconducting material. The semiconducting material is a semiconducting material adapted for optoelectronic applications, such as gallium arsenide (GaAs) and indium phosphide (InP). The material forming the mesa 130 has the second type of conductivity.

The mesa 130 has an average band gap width for which the energy is less than the energy of electromagnetic radiation 2 for which the wavelength is comprised in the operating range.

The mesa 130 and the second semiconducting layer 122 form the second semiconducting area 12. The parts of the mesa 130 and of the second semiconducting layer 122 for which the concentration of majority carriers is less than at least ten times the concentration of majority carriers of the first semiconducting layer 121 form the portion of the second semiconducting area 12. Said portion of the second semiconducting area 12 is essentially arranged in the mesa.

The first semiconducting layer 121 is in contact with the third semiconducting layer 123, this at the face which is opposite to the support 100 and this outside the region 121a. The third semiconducting layer 123 extends along the first semiconducting layer 121 on the surface of its face which is opposite to the support and which is not in contact with the second semiconducting layer 122.

The third semiconducting layer 123 is a semiconducting layer adapted for optoelectronic applications. The third semiconducting layer 123 is preferentially made in direct gap semiconducting material such as gallium arsenide (GaAs) and indium phosphide (InP). The third semiconducting layer 123 has a conductivity of the first type.

The concentration of majority carriers in the third semiconducting layer 123 may be at least equal to that of the first semiconducting layer 121, and preferentially greater than the latter.

The face of the third semiconducting layer 123 which is opposite to the second semiconducting layer 122 and the top of the mesa 130 are in contact with a first so-called insulating layer 153. The first insulating layer 153 is adapted for passivating the surface of the mesa 130 and of the third semiconducting layer 123 which it covers. It has an electric insulation property. Such an electric property may be obtained by increasing the band gap width along the thickness of the first insulating layer 153 from its face which is in contact with the third semiconducting layer 123 and the mesa 130 to the face which is opposite to the third semiconducting layer 123 and the mesa 130.

The first insulating layer 153 has a thickness of the order of a few tens to a few hundred nanometers.

Such a first insulating layer 153 may, for example, be obtained and in a particular case, by making the first insulating layer in cadmium-mercury telluride with a cadmium concentration which is varied, along the thickness of the layer, to the face which is opposite to the third semiconducting layer 123 and to the mesa 130, by a value corresponding to the concentration in the mesa 130 to a cadmium concentration equal to 1, i.e. of the CdTe.

The first insulating layer 153 is in contact, on its face which is opposite to the third semiconducting layer 123 and to the mesa 130, with a second insulating layer 154. The second insulating layer 154 extends along the first insulating layer 153 on its face which is opposite to the third semiconducting layer 123 and to the mesa 130.

The second insulating layer 154 is made in an insulating material conventionally used in microelectronics or optoelectronics, such as for example silicon dioxyde ($SiO_2$), silicon nitride (SiN), zinc sulfide (ZnS).

The second insulating layer 154 has a thickness from a few tens to a few hundred nanometers.

In the particular application, the second insulating layer 154 is preferentially zinc sulfide (ZnS).

The second insulating layer 154 is in contact on its face which is opposed to the first insulating layer 153, with a third insulating layer 155.

The third insulating layer 155 extends along the face of the second insulating layer 154 which is opposite to the first insulating layer 153.

The third insulating layer 155 is made in an insulating material conventionally used in microelectronics or optoelectronics, such as for example silicon dioxide ($SiO_2$), silicon nitride (SiN), cadmium telluride (CdTe).

The third insulating layer 155 has a thickness from a few tens to a few hundred nanometers.

In the particular application, the third insulating layer 155 is preferentially zinc sulfide (ZnS).

According to an alternative of the invention not shown, the third insulating layer 155 may be absent, the fourth insulating layer 156, illustrated in FIG. 1, being, according to this alternative, directly deposited in the second insulating layer 154.

The face of the insulating layer 155 which is opposite to the support forms a surface plane of the structure 10.

The first, second, and third insulating layers 153, 154, 155 form together for their parts extending along the third semiconducting layer 123, the first insulating area 151, while the parts of the first, second, and third insulating layers 153, 154, 155 which are present at the mesa, form the second insulating area 152.

The third semiconducting layer 123, the first, second, and third insulating layers 153, 154, 155 by not covering the region 121a of the first semiconducting layer 121, delimit, with the surface of the face of the second semiconducting layer 122 opposite to the support 100 and which is not covered by the mesa 130, the volume of the reflective area 141.

The reflective area 141 is in electric contact with the second semiconducting layer 122, on the surface of its face opposite to the support 100 which is not in contact with the base of the mesa 130, and the sides of the mesa 130. The reflective area 141 is formed in a material at least partly, and preferentially totally, reflecting electromagnetic radiations for which the energy is comprised in the operating range.

The material forming the reflective area 141 is a conductive material which is adapted for forming with the second semiconducting layer 122 and the mesa 130, a good quality electric contact which is preferably ohmic. The material forming the reflective area is preferentially gold (Au).

In the particular application, the reflective area 141 is made in gold (Au), the interface between the reflective area 141 and the mesa 130 and the second semiconducting layer 122 is improved by means of a layer of hangs in metal, for example selected from the group including chromium (Cr), titanium (Ti) and tantalum (Ta).

In the particular application illustrated in FIG. 1, the reflective area 141 is in electric contact with a first contact pad 142 adapted for allowing electric contact by hybridization with indium balls. Such an electrode is illustrated in FIG. 1, protruding from the surface plane of the structure.

The third semiconducting layer 123, the first, the second and the third insulating layers 153, 154, 155 have a breakthrough gap forming a passage for the second electric contact. The second electric contact includes a conductive via 143 passing through the passage.

In the particular application illustrated in FIG. 1, the second contact includes a second contact pad 144 in electric contact with the via and protruding from the surface plane of the structure 10. The second contact pad 144 is adapted so as to allow electric contact by hybridization with indium balls.

Such a structure 10, as illustrated in FIG. 1, allows focusing in the cavity formed by the mesa 130, of the electromagnetic radiation 2 received by the structure 10 for which the wavelength is comprised in the wavelength range, on an area of the surface of the substrate 100 which extends on either side of the mesa 130 over $\lambda_0/2n_i$.

Such a structure 10, when it corresponds to the particular application illustrated in FIG. 1, may be manufactured by a manufacturing method as illustrated in FIGS. 4a to 4n. Such a manufacturing method includes the steps:

providing the semiconducting support 100, as this is illustrated in FIG. 4a, forming as illustrated in FIG. 4b, the first semiconducting layer 121 in contact with the first face of the support 100, forming, as illustrated in FIG. 4c, the third semiconducting layer 123 in contact with the face of the first semiconducting layer 121 which is opposite to the support, forming, as illustrated in FIG. 4d, the first insulating layer 153 in contact with the face of the third semiconducting layer 123 which is opposite to the first semiconducting layer 121, forming, as illustrated in FIG. 4e, the second insulating layer 154 in contact with the face of the first insulating layer 153 which is opposite to the third semiconducting layer 123, forming, as illustrated in FIG. 4e, the passage, for the second electric contact, through the first and the second insulating layer 153, 154, of the third semiconducting layer 123 and partly (or totally) of the first semiconducting layer 121, etching, at the region 121a of the first semiconducting layer 121, the first and second insulating layers 153, 154, the third semiconducting layer 123 and a portion of the first semiconducting layer 121 so as to form the mesa 130 and the second semiconducting layer 122, the etching step allowing a change in the carrier concentration of the portion of the first and of the second semiconducting layer 121, 122 forming the mesa 130 and the second semiconducting layer 122, as this is illustrated in FIG. 4f, filling, as illustrated in FIG. 4g, the passage and the space of the first and second insulating layers 153, 154, the third semiconducting layer 123 and a portion of the first semiconducting layer 121, which is etched, with a material at least partly reflective in the operating range so as to form a second electric contact and the reflective area 141, said reflective area 141 being in electric contact with the sides of the mesa 130 and with the second semiconducting layer 122, the reflective area forming the first electric contact, filling, as illustrated in FIG. 4g, the space made during the etching step at the region 121a illustrated in the FIG. 4e, with an electrically conductive material in order to form an electric contact 143, if necessary forming, as illustrated in the FIG. 4h, the third insulating layer 155 in contact with the face of the second insulating layer 154 opposite to the first insulating layer 153 and with the at least partly reflective material forming the reflective area 141 and the material forming the electric contact 143, removing, as illustrated in FIG. 4i, the part of the third insulating layer 155 which is in contact with the reflective area 141 and the one which is in contact with the electric contact 143, depositing, as illustrated in FIG. 4j, a first layer of at least partly reflective material 145 in contact with the third insulating layer 155 and with the at least partly reflective material present in the passage and the one making up the reflective area 141 and with the electric contact 143, removing, as illustrated in FIG. 4k, the major part of the at least partly reflective material layer 145 which is in contact with the third insulating material layer 155, forming, as illustrated in FIG. 4l, a fourth insulating layer 156, made in the same insulating material as the third insulating layer 155, said fourth insulating layer 156 being in contact with the third insulating layer 155 on its face which is opposite to the second insulating layer 154 and with the first layer of at least partly reflective material 145, removing, as illustrated in FIG. 4m, a part of the fourth insulating layer 156 in order to produce a passage towards the material 141 on the one hand and through the material 143 on the other hand, forming, as illustrated in FIG. 4n, electric contacts 142 and 144, in an electrically conducting material, in electric contact with the portion of the first at least partly reflective layer 145.

The etching step during the formation of the mesa 130 and of the second area is particularly related to the particular application. Indeed, the change of the type of conductivity obtained during this etching step is allowed by a particularity for obtaining the conductivity of the type in which the majority carriers are holes. In mercury-cadmium telluride $Cd_xHg_{x-1}Te$, the type of conductivity may be obtained by means of mercury Hg voids which may be at least partly filled by diffusion of mercury during the suitable etching of a neighboring area. Thus, with a first and third semiconducting layer 121, 123 further comprising a low concentration of electron donor impurities, the etching of the area and the filling of the voids, and therefore the inhibition of holes allows inversion of the type of conductivity.

Moreover, because of this etching step, the mesa 130 and the second semiconducting layer 122 have at their surface which is respectively on the faces of the pyramid frustum and on the planar face in contact with the reflective area 141 which is opposite to the support, a thickness along which the concentration of majority carriers is greater than the concentration in the remainder of the mesa 130 and in the remainder of the second semiconducting layer 122. Such a thickness respectively at the faces of the mesa 130 and at said surface of the second semiconducting layer 122 on which the majority carrier concentration is greater, gives the possibility of providing improved electric contact with the reflective area 141.

A method of manufacturing a structure 10, the materials of which do not allow a change in a type of conductivity, may also be contemplated without departing from the scope of the invention. According to this possibility, the manufacturing method then includes additional steps for etching and forming a second semiconducting layer 122 and the mesa 130.

A structure 10 obtained by mean of such a manufacturing method has a band diagram along the first, the second semiconducting layer 121, 122 and the mesa 130, and according to the dashed lines present in FIG. 2, as schematized in FIG. 5

In FIG. 5, the dashed lines illustrate the influence, during operation, of the reverse bias of the structure on the band diagram of the same structure. It is thus possible to see a strong difference between the concentration of majority carriers in the first semiconducting layer 121 and in the second semiconducting layer 122 and the mesa 130. This effect is schematically amplified in FIG. 5, the potential drop illustrated in this figure, for comprehensive reasons, being totally absorbed along the thickness of the mesa 130.

Thus, it may be seen in FIG. 5 that a low potential difference applied between the first and the second electric contact 142, 144, is sufficient for inducing depletion of the majority carriers on the quasi totality of the thickness of the mesa 130. The result of the latter is both reduction in the darkness current in the junction, depletion of majority carriers reducing the risk of electron-hole pair transitions of the Auger type in the mesa, and separation of the carriers generated by the electromagnetic radiation which is obtained by flow, due to the potential difference, but not by diffusion. Both of these mechanisms allow an improvement in the signal-to-noise ratio of the structure.

The improvement of the signal-to-noise ratio which results from this is added to that which is related to the focusing of the electromagnetic radiation obtained by means of the Fabry-Pérot cavity, which allows reduction in the functional volume of the structure with the mesa with low impact on the surface area for collecting the electromagnetic radiation (see the collection area 20 in FIG. 1) and by the fact that the first area of the structure, the one formed in the first semiconducting layer, has a greater band gap width, therefore low generation of a darkness current.

The invention also relates to a semiconducting component 1, as illustrated in FIG. 6, including a plurality of structures 10a, 10b, 10c, according to the invention. With such a component 1, structures 10a, 10b, 10c, are preferentially laid out in a two dimensional network extending along the substrate. In such a component 1, the first semiconducting layer 121 is common to the whole of the structures 10a, 10b, 10c, giving the possibility of common biasing of the whole of the first areas of the structures of the component while the second area of each of the structures is biased independently.

As the principle of placing structures according to such an arrangement is moreover known, such a component is not described in detail in this document.

FIGS. 7a, 7b, and 7c illustrate three conformation examples of the mesa 130. In FIG. 7a, the mesa assumes a pyramid frustum shape with a square base while in FIGS. 7b and 7c, the mesa assumes a frusto-conical shape and a prism frustum shape respectively.

FIGS. 7d to 7f and FIG. 8 illustrate possibilities of the invention in which the structure includes several mesas 130a, 130b, 130c each forming a cavity of the Fabry-Pérot type each associated with a semiconducting junction. According to a first possibility, illustrated in FIGS. 7d, 7e, 7f and 8, the mesas may have the same form factor and according to a second possibility of the invention, not shown, the mesas may have different form factors.

According to the first possibility, the mesas 130a, 130b, 130c have a same form factor adapted for the first operating range. Thus, according to the principle illustrated in FIG. 7, each of the cavities formed by one of the mesas allows focusing of a portion of electromagnetic radiation received by the structure allowing an increase in the surface area over which the electromagnetic radiation is collected. According to this possibility, as the arrangement of the cavities may be periodic, the periodicity will preferentially be different from $\lambda_0/n_i$ with the optical index of the area for receiving the electromagnetic radiation, i.e. the optical index of the support.

According the second possibility, the mesas of a same structure each having a form factor which is different, focus the electromagnetic radiation received by the structure over a different range of wavelengths and thus allow an increase in the range of wavelengths in which the structure operates. Indeed, each of the junctions, by the focusing of the radiation in a given range of wavelengths, will be mainly sensitive to electromagnetic radiation in said given wavelengths, the signals of the different junctions add together, the structure has a sensitivity over a range of wavelengths, including the ranges of wavelengths of each of the cavities.

According to this same second possibility, the material forming each of the mesas 130a,b,c have a band gap width for which the energy is less than that of electromagnetic radiation comprised in the range of wavelengths including the lowest energy. Also, the first and the second semiconducting layer have a band gap width, for which the energy is greater than the energy of electromagnetic radiation 2 for which the wavelength is comprised in the range of wavelengths including the highest energy.

According to a third possibility, not shown, the structure 10 may not have a part or the totality of the stack formed by the first, the second, and the third insulating layer 153, 154, 155 which is in contact with the top of the mesa 130. Indeed, as such a stack does not participate in the confinement of the Fabry-Pérot cavity, its absence does not influence in anyway the operation of the structure.

Figure 9:
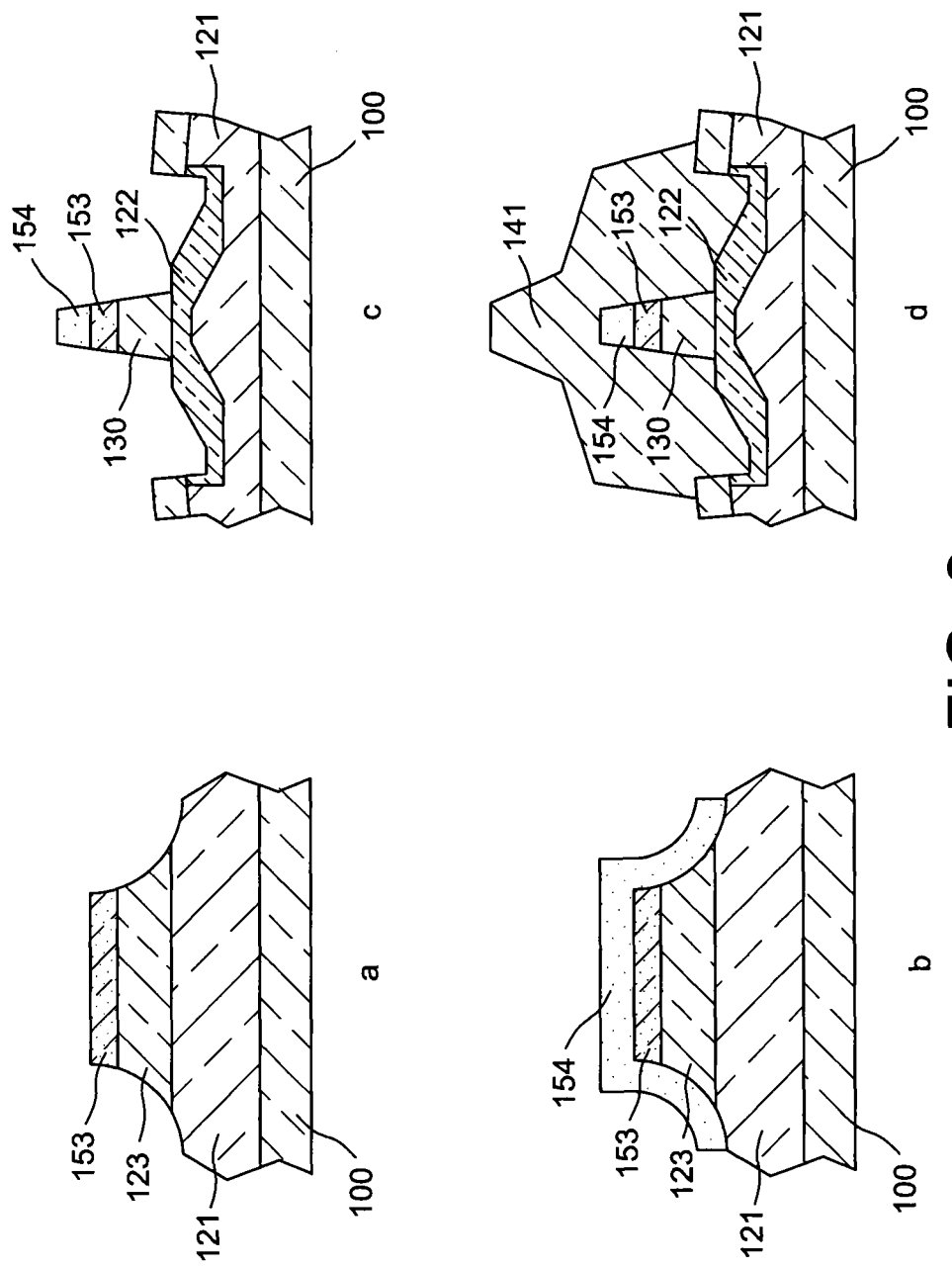

According to a second embodiment of the structure 10 for which the main manufacturing steps are illustrated in FIG. 9, the structure 10 may have a second semiconducting layer 122 with reduced size as compared with the structure 10 according to the first embodiment.

The method for manufacturing a structure 10 according to a second embodiment is different from the method for manufacturing a structure 10 according to the first embodiment in that it includes an additional step consisting, after depositing the first insulating layer 153, of suppressing the portion of the stack formed by the first insulating layer 153 and the third semiconducting layer 123, which is not at the region 121a of the first semiconducting layer 121. According to this possibility in the step for forming the second insulating layer 154, the second insulating layer 154 is in contact, for its part which is not at the region 121a of the first semiconducting layer 121, with the first semiconducting layer 121 on its face which is opposite to the support 100.

Such a structure 10 notably has the advantage, as compared with the structure according to the prior art, of having a second semiconducting layer 122 of reduced volume. Such a second semiconducting layer 122 for which the volume is reduced, allows limitation of the darkness current which may be generated in said second semiconducting layer 122.

In the whole of the embodiment described above for which at least one of the cavities is a cavity of the Fabry-Pérot type, the reflective sides of each of the cavities of the Fabry-Pérot type are obtained by means of a reflective area. It may also be contemplated, without departing from the scope of the invention, that the reflective sides of each of the cavities are formed by means of Bragg mirrors. Such Bragg mirrors may be formed, for example, by a stack of semiconducting layers.

It may also be contemplated, without departing from the scope of the invention, that the mesa(s) is(are) partly or totally without any contact with the insulating layers 153, 154, 155.

According to another possibility of the invention, not shown, it is also possible, this without departing from the scope of the invention, that the structure does not include any support. According to this possibility, the electromagnetic radiation is received by the structure through an air area with an optical index $n_i$ equal to 1.

The invention claimed is:

1. A method for manufacturing a structure configured to receive electromagnetic radiation in a first operating range of wavelength which is centered around a wavelength $\lambda_0$, the received electromagnetic radiation being directed along a receiving direction, the method for manufacturing comprising:

providing a support having a first and a second face;

forming a first semiconducting layer of a first type of conductivity, at least one portion of the first semiconducting layer forming a first semiconducting area;

forming a semiconducting mesa in contact with the first semiconducting layer, the mesa being of a second type of conductivity opposed to the first type of conductivity and including a mesa portion, in contact with the first semiconducting layer, for which a concentration of majority carriers is at least ten times less than a concentration of majority carriers of the first semiconducting layer, the mesa having one or more confinement directions, along which the mesa has an average dimension of $\lambda_0/2n_{eff}$, the mesa at least partly forming a second semiconducting area, and a part of the mesa at least partly forming a portion of the second semiconducting area, depositing a layer of a material at least partly reflective in the operating range to form a reflective area, the reflective area covering at least one part of the mesa to form a first optical cavity which has an average dimension substantially equal to $\lambda_0/2n_{eff}$ along the one or more confinement directions, wherein the first optical cavity is configured to focus at least a part of the received electromagnetic radiation towards the first optical cavity for converging and concentrating the part of received electromagnetic radiation in the first optical cavity and the electromagnetic radiation is received through a receiving direction upstream to the first optical cavity from the first semiconducting area to the second semiconducting area, wherein the support forms a medium in which the electromagnetic radiation is received, the medium being of optical index $n_i$, as an incident index, the ratio between the effective index and the incident index $n_{eff}/n_i$ being greater than 1, and wherein the one or more confinement directions being perpendicular to the receiving direction.

2. A method for manufacturing a structure configured to receive electromagnetic radiation in a first range of operating wavelengths which is centered around a wavelength $\lambda_0$, the received electromagnetic radiation being directed along a receiving direction, the method for manufacturing comprising:

providing a support having a first and a second face;

forming a first semiconducting layer of a first type of conductivity, at least one portion of the first semiconducting layer forming a first semiconducting area;

forming a second semiconducting layer in contact with the first semiconducting layer, the second semiconducting layer being of a second type of conductivity which is opposed to the first type of conductivity, at least a part of the second semiconducting layer being in contact with the first semiconducting layer and having a concentration of majority carriers which is at least ten times less than a concentration of majority carriers of the first semiconducting layer, forming a semiconducting mesa in contact with the part of the second semiconducting layer, the mesa being of the second type of conductivity and having a concentration of majority carriers at least ten times less than a concentration of majority carriers of the first semiconducting layer, the mesa having one or more confinement directions, along which the mesa has an average dimension of $\lambda_0/2n_{eff}$, at least a mesa part of the mesa and the part of the second semiconducting layer forming a portion of a second semiconducting area which is essentially included into the mesa; and depositing a layer of a material at least partly reflective in the operating range, the layer covering at least one part of the mesa to form a first optical cavity which has an average dimension substantially equal to $\lambda_0/2n_{eff}$ along the one or more confinement directions, wherein the first optical cavity is configured to focus at least a part of the received electromagnetic radiation toward the first optical for converging and concentrating the part of received electromagnetic radiation into the first optical cavity and the electromagnetic radiation is received through the receiving direction upstream to the first optical cavity from the first semiconducting area to the second semiconducting area, wherein the support forms a medium in which the electromagnetic radiation is received, the medium being of optical index $n_i$, as an incident index, the ratio between the effective index and the incident index $n_{eff}/n_i$ being greater than 1, and wherein the one or more confinement directions being perpendicular to the receiving direction.

3. The manufacturing method according to claim 2, further comprising, before the forming the second semiconducting layer, forming a third semiconducting layer of the first type of conductivity in contact with the first semiconducting layer, the first semiconductor layer and the third semiconducting layer including a concentration of impurities of the minority carrier donor type of the first type of conductivity, which is at least ten times less than a concentration of majority carriers of the first and third semiconducting layers, the forming the mesa and the second semiconducting layer being obtained by etching the third conductive layer and a portion of first semiconducting layer, this etching to inhibit the majority carriers of the first type of conductivity.

* * * * *